United States Patent
Dietl et al.

(10) Patent No.: US 6,947,510 B2
(45) Date of Patent: Sep. 20, 2005

(54) CIRCUIT FOR GENERATING AN OUTPUT PHASE SIGNAL WITH A VARIABLE PHASE SHIFT RELATIVE TO A REFERENCE PHASE

(75) Inventors: Markus Dietl, Munich (DE); Sotirios Tambouris, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 873 days.

(21) Appl. No.: 09/877,583

(22) Filed: Jun. 8, 2001

(65) Prior Publication Data

US 2002/0021775 A1 Feb. 21, 2002

(30) Foreign Application Priority Data

Jun. 9, 2000 (DE) .......................................... 100 28 603

(51) Int. Cl.[7] .................................................. H04L 7/00
(52) U.S. Cl. ....................... 375/354; 375/357; 375/371; 375/376; 331/34; 327/159
(58) Field of Search ................................ 327/175, 159, 327/119, 231, 291; 331/16, 34, 74, 135; 375/354, 357, 371, 376

(56) References Cited

U.S. PATENT DOCUMENTS

| | | | | |
|---|---|---|---|---|
| 5,245,637 A | * | 9/1993 | Gersbach et al. | ........... 375/374 |
| 6,228,344 B1 | * | 5/2001 | Dorshow et al. | ............. 424/9.1 |
| 6,380,774 B2 | * | 4/2002 | Saeki | .......................... 327/119 |
| 6,525,615 B1 | * | 2/2003 | Masenas et al. | ............... 331/34 |
| RE38,482 E | * | 3/2004 | Leung et al. | ................ 375/357 |

* cited by examiner

*Primary Examiner*—Shuwang Liu
(74) *Attorney, Agent, or Firm*—J. Dennis Moore; W. James Brady, III; Frederick J. Telecky, Jr.

(57) ABSTRACT

A circuit generating an output phase signal with an optionally variable phase shift relative to a reference phase. It includes an oscillator (10) outputting phase signals at n outputs, each of which differs in phase by $\phi=360°/n$. These phase signals are applied selectively via multiplexers to a phase interpolator, at the output of which the signal changed in phase relative to a reference phase. The output phase signal is generated in a charging circuit in which a capacitor can be varied by signaling current sources ON/OFF with the aid of phase switches in accordance with the phasing to be produced for the output signal. To avoid jitter in the transition from one phase to another separating switches are inserted in the connection between the current sources and the charging circuit, these separating switches being controlled so that they are never open at the same time.

2 Claims, 3 Drawing Sheets

CIRCUIT FOR GENERATING AN OUTPUT PHASE SIGNAL WITH A VARIABLE PHASE SHIFT RELATIVE TO A REFERENCE PHASE

FIELD OF THE INVENTION

The invention relates to a circuit assembly for generating an output phase signal with an optionally variable phase shift relative to a reference phase.

BACKGROUND OF THE INVENTION

In the field of telecommunications and data processing there are applications in which it is necessary to synchronize a first sequence of signals with a second such sequence. For example, it may be required to bring a locally generated signal sequence into alignment with a received signal sequence both in frequency and phase. To achieve this alignment the locally generated signal sequence needs to be continually locked to the phase of the received signal sequence. For this purpose circuit assemblies, termed phase aligners are put to use. An example of one such phase synchronizer reads from IEEE Journal of Solid-State Circuits, Vol. 32, No. 11, November 1997 in "A Semidigital Dual Delay-Locked Loop". This known phase synchronizer is in principle a circuit assembly for generating an output phase signal with an optionally variable phase shift relative to a reference phase, it including an oscillator outputting phase signals at n outputs each of which is shifted in phase by $\phi=360°/n$ from one output to the next and is correspondingly staggered in time relative to each other by $\Delta t$, a first multiplexer, the inputs of which are connected to the even-number outputs of the oscillator and which passes on to its output a phase signal output by an output x of the oscillator as a function of a phase selection signal determined by the phase output signal to be generated, a second multiplexer the inputs of which are connected to the odd-number outputs of the oscillator and which passes on to its output a phase signal output by an output x+1 of the oscillator as a function of a phase selection signal determined by the phase output signal to be generated, a phase interpolator receiving the phase signals output by the multiplexers and controlling with these the periodic opening and closing of phase switches in the time spacing of $\Delta t$, the phase interpolator containing a charging circuit in which a charging voltage of a capacitor is varied by switching current sources assigned to the phase switches on or off in accordance with the closing or opening of the phase switches, whereby a number of current sources is provided corresponding to the number of interphase shift values to be generated between the phase shifts of the phase signals determined by the phase select signal, to each of which at least two phase switches are assigned, of which the one in each case is controlled by the phase signal output by the first multiplexer and the other by the phase signal output by the second multiplexer, a first separating switch being inserted in the connection between each of the phase switches and the assigned current source.

This circuit assembly makes it possible by periodic opening and closing of the phase switches to generate output phase signals, the phasing of which continually varies relative to the reference phase so that the object of phase synchronization is achievable by another signal. Actual practice has shown, however, that on opening and closing the phase switches and in thereby varying the phase as wanted from one value to the next no smooth transition is attained, instead phase fluctuations, also termed jitter, materializing. These phase fluctuations are undesirable and need to be eliminated as best possible to achieve a quasi-continuous phase shift.

SUMMARY OF THE INVENTION

The invention is based on the object of configuring a circuit assembly of the aforementioned kind so that the jitter in the transition from one phase value to the next as occurring in prior art is at least minimized if not eliminated.

In accordance with an embodiment of the invention, in each connection between each phase switch and the charging circuit a second separating switch is inserted and that a control circuit is provided which ensures that the first separating switches assigned to each phase switch and the second separating switches assigned to the same phase switch are never open at the same time when there is a change in the phasing of the output phase signal relative to the reference phase.

By inserting the additional separating switch and controlling all separating switches by the control circuits such that all separating switches are never open at the same time, it is assured that no or only minimized jitter occurs in the transition from one phase shift value to the next.

BRIEF DESCRIPTION OF THE DRAWINGS

The invention will now be detailed by way of example with reference to the drawing in which.

DETAILED DESCRIPTION OF THE INVENTION

Figure 1:
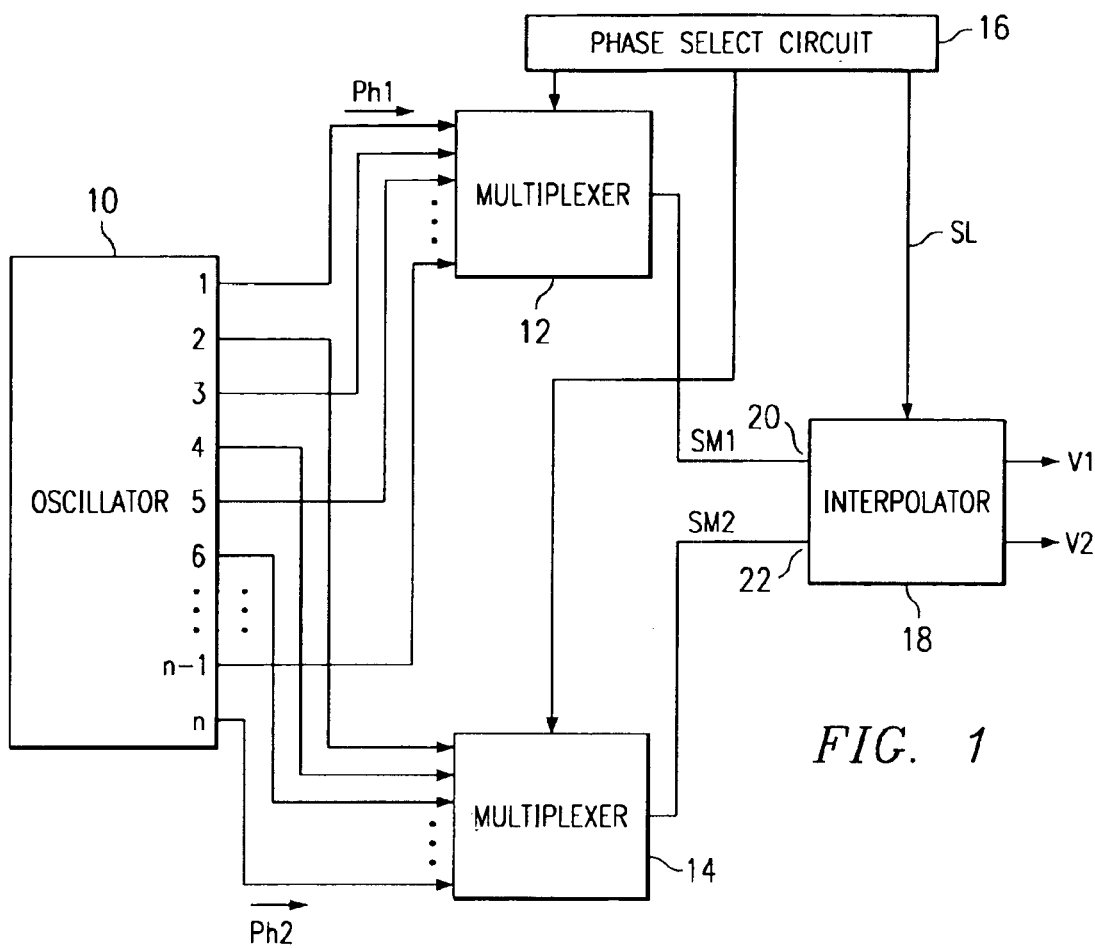
FIG. 1 is a general block diagram explaining application of the circuit assembly in accordance with the invention.

The circuit assembly to be explained may be termed a phase interpolator, due to the way in which it works, since it makes it possible to generate optionally variable phase shifts relative to a reference phase. Referring now to FIG. 1 there is illustrated how the phase signal output by the output 1 of the oscillator 10 may be used, for example, as the reference phase. This oscillator 10 furnishes at its outputs 1-n phase signals each of which varies from the other by $360°/n$. As evident the phase signals output by the even-number outputs are applied to a multiplexer 12 while the phase signals output by the uneven outputs of the oscillator 10 are applied to the multiplexer 14. As a function of a phase select signal output by a phase select circuit 16 the multiplexers 12 and 14 pass on each of the phase signals output by two adjacent outputs of the oscillator 10 to their outputs and communicate them to the interpolator 18. The signals passed on must not necessarily be the phase signals themselves, they could also be switching signals whose phase precisely corresponds to the phase of two selected adjacent outputs of the oscillator 10. The interpolator 18 generates with the aid of the signals applied to it an output signal whose phase shift has a value between the phase shift of the signals at the selected adjacent outputs of the oscillator 10, this value being determinable by the phase select circuit 16.

Referring now to the greatly simplified circuit diagram of FIG. 2 and the plot of FIG. 3 the principle of the interpolator will now be explained.

Figure 2:
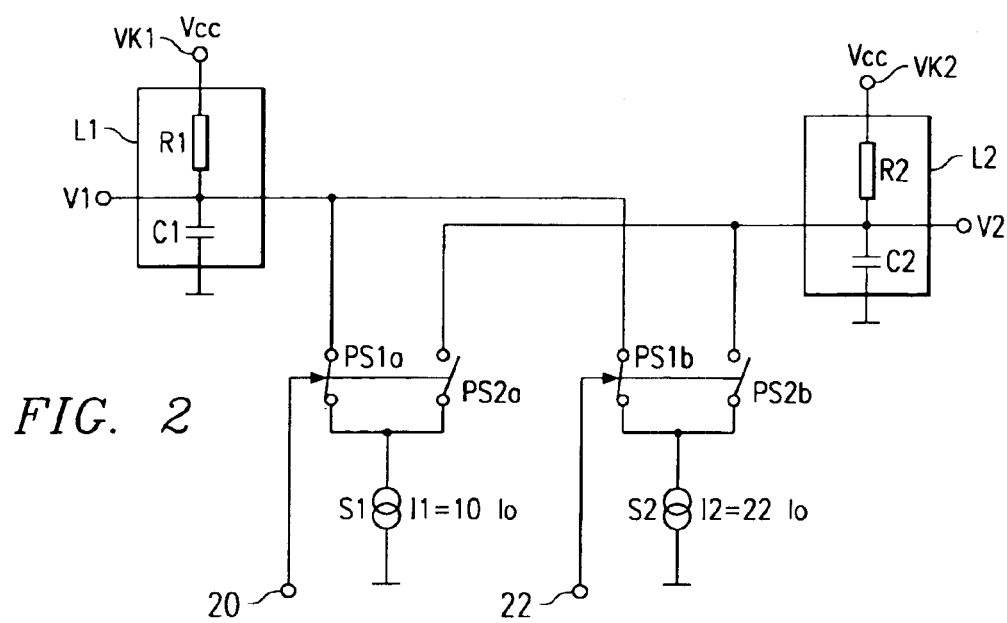
FIG. 2 is a greatly simplified basic drawing in explaining the principle forming the basis of the circuit assembly in accordance with the invention.

The circuit assembly as shown in FIG. 2 comprises two control inputs 20, 22 which receive the output signals SM1 or SM2 from the multiplexer 12 and multiplexer 14 respectively. These signals SM1 and SM2 are derived from phase signals applied to the multiplexers from the outputs 1 and 2 of the oscillator 10. These phase signals are depicted in FIG. 3 as Ph1 and Ph2 respectively. The signals SM1 and SM2 control two arrays of switches PS1$a$, PS2$a$ and PS1$b$, PS2$b$ respectively. These switches flip every time the phase signals Ph1 and Ph2 output by the multiplexers 12, 14 have the scaled value 0.5. As evident, the switches in each array are controlled so that one of the two switches is closed when the other is open. The switching signals result in the switches assuming the other condition in each case. A charging circuit L1 contains a resistor R1 and a capacitor C1 in series therewith between a supply voltage terminal VK1 and ground. A charging circuit L2 contains a resistor R2 and a capacitor C2 in series therewith between a supply voltage terminal VK2 and ground. Applied to the supply voltage terminals VK1 and VK2 is the same supply voltage Vcc. The output voltage to be generated suitably shifted in phase is available at the terminals V1 and V2 respectively, each of which connects the junction between the resistor and the capacitor in the corresponding charging circuit.

In describing how the circuit shown in FIG. 2 works it is assumed that the current source SI can furnish a current I1 which is ten times larger than an assumed basic current Io while the current source S2 can furnish a current I2 which is twenty times larger than the basic current Io.

In describing how this works in FIG. 2 it will only first be explained how the output voltage V1 is generated, generating the voltage V2 being namely totally analogous to generation of the output voltage V1, it merely being shifted 180° in phase relative to the voltage V1.

It is first assumed that the switches PS1$a$ and PS1$b$ are closed so that via the resistor R1 a current can flow amounting to 32 Io, thus resulting in a very low charging voltage at the capacitor C1 which simultaneously represents the output voltage V1. When then at the point in time $t_0$ the signal SM1 derived from the phase signal Ph1 is applied to the switch PS1$a$ this switch is opened. This means that via the resistor only a current now having the value 22 Io can flow since the connection to the current source S1 is open-circuited. The charging voltage at the capacitor C1 thus starts to increase in the range $t_0$ to $t_1$ as evident from the profile of this voltage V1 as shown in FIG. 3. The voltage increase occurs relatively slowly since 22 Io can still flow from capacitor C1.

At the point in time $t_1$ the signal SM2 derived from the phase signal Ph2 is applied to the switch PS1$b$ so that this switch too is opened. This results in current sources S1, S2 no longer being connected to the junction between the resistor R1 and the capacitor C1 so that the charging voltage across the capacitor C1 in accordance with the time constant as dictated by these two components quickly increases to the high value of the supply voltage Vcc. This increase is evident from FIG. 3 which commences at the point in time $t_1$, FIG. 3 also making it evident that the phase of the voltage V1 is shifted by $\Delta\phi_a$ relative to the phase of the phase signal PH1.

If it is desired to achieve some other phasing of the voltage V1, all that is needed is to change the ratio of the two currents I1 and I2 in the circuit as shown in FIG. 1. If, for instance, a smaller phase shift $\Delta\phi_a$ relative to the phasing of the phase signal PH1 is to be attained, then the current I1 needs to be set to a higher value and the current I2 made correspondingly smaller. The voltage V1 would then increase faster in the range $t_0$ to $t_1$ so that the further voltage increase occurring as of the point in time $t_1$ would follow on from this higher voltage value at the point in time $t_1$ to thus earlier attain the reference point in consideration for determining the phase shift for a scaled voltage value 0.5. This is shown, for example, by the dashed line plot of the voltage V1' which attains the point dictating the phase already at $t_2$.

Figure 3:
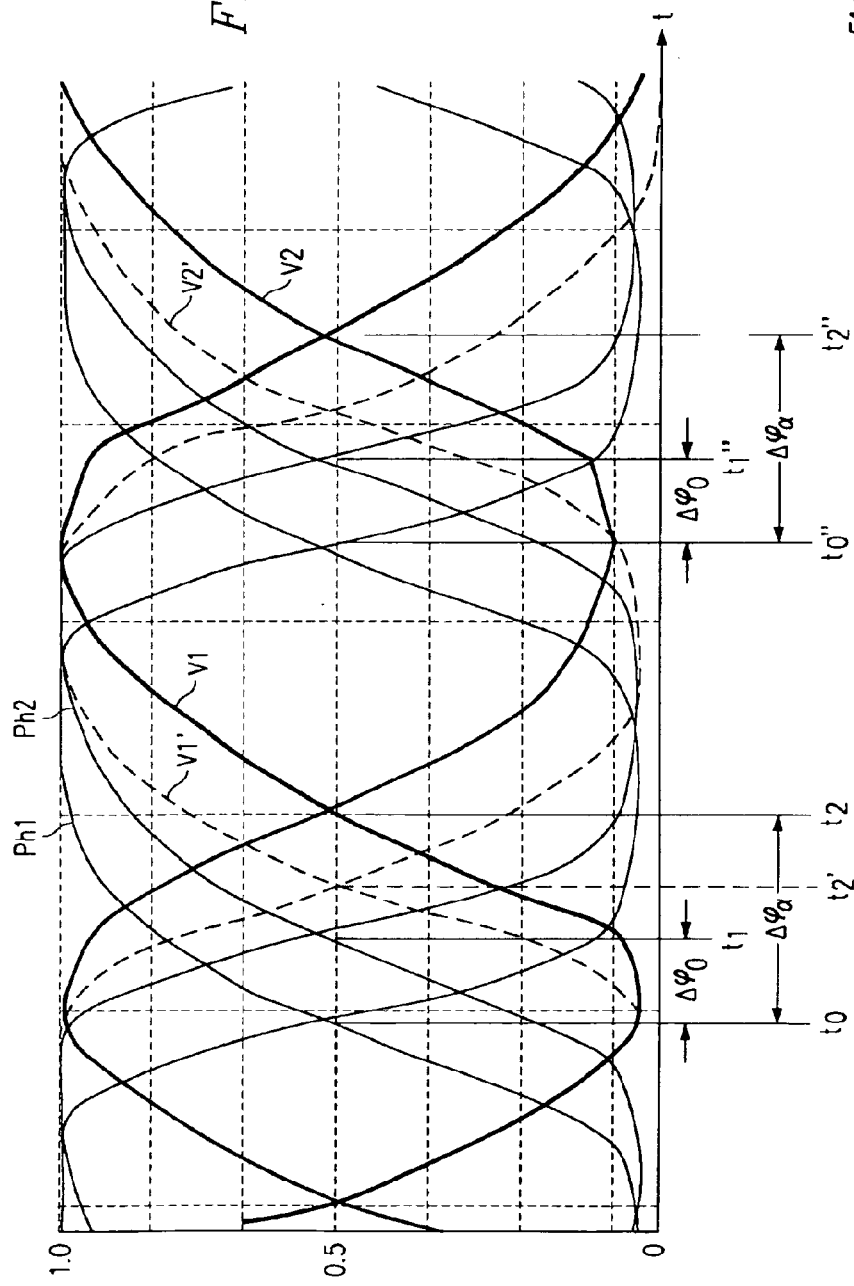
FIG. 3 is a plot of scaled signals to which reference is made in explaining the invention.

Each of the switches PS2$a$ and PS2$b$ is driven in opposite to the switches PS1$a$ and PS1$b$ to produce an output voltage V2 which as evident from FIG. 3 is shifted 180° in phase relative to the voltage V1. Producing these two output voltages is founded in that the systems concerned mainly make use of differential components such as operational amplifiers having a differential output so that in all stages of processing two signals, namely the direct signal and the signal shifted in phase by 180°, are always needed.

Figure 4:
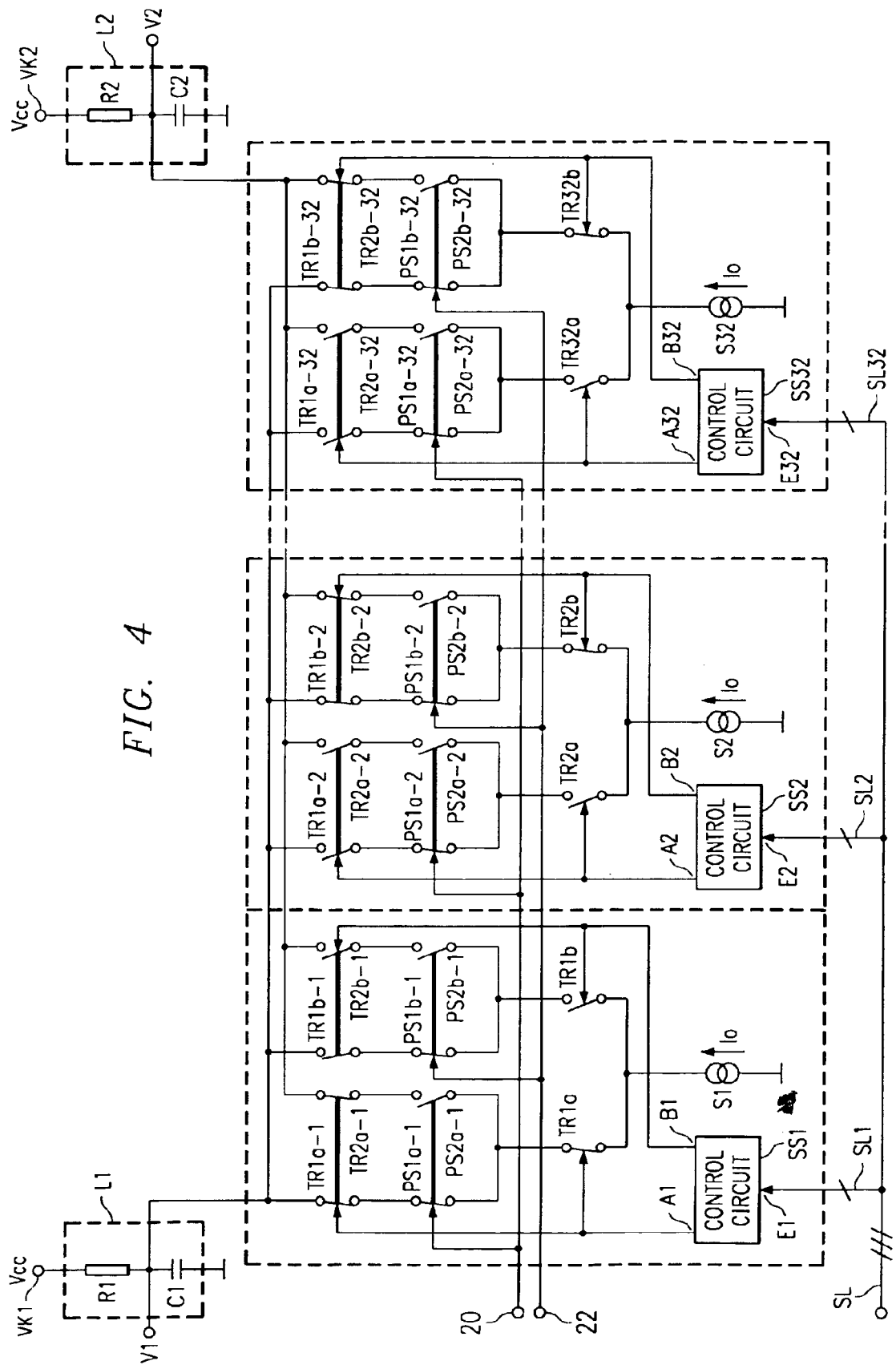

Referring now to FIG. 4 there is illustrated a circuit in accordance with the invention which also works on the principle of generating phase shifted signals, but here with further switches included with a special means of actuating these switches. In addition, for each switch array a separate current source exists, each furnishing the basic current value basic current value Io meaning that in all 32 switching stages and correspondingly 32 current sources are provided.

While it was assumed in describing the known principle with reference to FIG. 2 that an output signal and the corresponding output signal phase-shifted by 180° are to be produced with a defined phase relative to the phase signal Ph1, the circuit as shown in FIG. 4 making use of the known principle serves to generate an output signal and the corresponding output signal phase-shifted by 180° with a phasing which continually changes relative to the reference phase of the phase signal Ph1. The additional switches as already mentioned ensure that the transition from one phase to the next is achieved with no phase jitter. These additional switches are switches TR1$a$, TR1$b$ to TR32$a$, TR32$b$ inserted in conjunction with each of the current sources S1 to S32 with the corresponding phase switches PS1$a$-1, PS2$a$-1 to PS1$a$-32, PS2$a$-32 or PS1$b$-1, PS2$b$-1, PS1$b$-32, PS2$b$-32. Further switches TR1$a$-1, TR2$a$-1 to TR1$a$-32, TR2$a$-32, TR1$b$-1 to TR1$b$-32, TR2$b$1 to TR2$b$-32 are inserted in the connection between each phase switch and the corresponding charging circuit L1 and L2 respectively as likewise evident from FIG. 4.

In subsequently describing how the output signals are generated with continually changing phase relative to the reference phase formed by the phase signal Ph1 only the output signal at the output V1 will be considered; the output signal at the output V2 being simply the signal phase-shifted by 180° relative to the signal at the output V1 as already explained regarding the circuit as shown in FIG. 2. All switches PS1$a$ and PS1$b$ as evident from FIG. 4 are initially ON and the control circuit SS1 outputs at its output a signal which maintains the TR1$a$ and TR1$a$1 ON. At output B it outputs a signal which maintains the TR1$b$ and TR1$b$-1 ON, whereas the control circuits SS2 to SS32 each output signals at their outputs A and B which set the cited switches in the opposite condition.

Each of the control circuits SS1 to SS32 is controlled by a signal at its inputs E1 to E32, each control circuit being signaled via a core SL1 to SL32 of a 32-core control line SL so that periodically first the control circuit SS1 revives a drive signal, then in addition control circuit SS2 and each of the further control circuits in sequence until in the end the drive signal is applied to all control circuits, after which the whole sequence of applying the drive signals is repeated. Discussing how the circuit as shown in FIG. 4 functions begins, as already mentioned, by only control circuit SS1 receiving the drive signal and the separating switches assuming the positions as already mentioned.

As evident in the starting condition shown, there is a connection between the current sources S1-S32 and the charging circuit L1 via the closed switches PS1a-1 to PS1a-32 and PS1b-2 to PS1b-32 as well as via the closed separating switches TR1a, TR1a-1 and TR2b to TR32b and TR1b-2 to TR1b-32. When the signal SM1 derived from the phase signal Ph1 attains from the multiplexer 12 the input 20 all switches PS1a-1 to PS1 a-32 are opened, prior to which at to the output voltage V1 at the output of the charging circuit L1 was at its lowest value as evident from the plot in FIG. 3. Opening the switches PS1a-1 to PS1a-32 merely parts the current source S1 from the charging circuit L1, the other current sources S2 to S32 continuing to be connected to the charging circuit L1 via the closed separating switches TR2b to TR32b and TR1b-2 to TR1b-32 and closed phase switches PS1b-2 to PS1b-32. This is why the output voltage V1 increases only unsubstantially up to the point in time t(1). When then at the point in time t(1) the signal SM2 from multiplexer 14 likewise attains the input 22 prompting changeover of the phase switches PS1b-1 to PS1b-32 into the closed condition then the output voltage V1 increases as plotted in FIG. 3 up to its maximum value with charging of the capacitor C1.

At the point in time $t_0"$ the signal SM1 is again applied to the input 20 so that the switches PS1a-1 to PS1s-32 are again closed. Since, however, only the separating switch TR1a is closed, this has little effect on the voltage V1 and thus it drops only slightly in the range $t_0"$ to $t_1"$. It is not until the signal SM2 at the input 22 has opened all switches PS1b-1 to PS1b-32 that the voltage V1 drops as plotted in FIG. 3 to the minimum. The resulting voltage V1 has a phase shift $\Delta\phi_a$ relative to the reference phase as dictated by the phase signal Ph1. To this extent the function is the same as that of the basic drawing as shown in FIG. 2, except that in the circuit as shown in FIG. 4 it can be achieved by the effect of the control signal applied to the control circuits SS1 to SS32 that the phasing of the output voltage V1 changes in 32 steps over a range corresponding to the phase shift of the two phase signals Ph1 and Ph2. Thus, when in the case as described, a signal having the phase shift $\Delta\phi_a$ relative to the phasing of the phase signal Ph1 is generated, the output voltage V1 can be phase shifted in the next step by $\Delta\phi_0/32$ when in addition to the control circuit SS1 also the control circuit SS2 is activated.

Activating the control circuit SS2 results in a signal being output at its output A2 which closes the separating switches TR2a, TR1a-2 and TR2a-2. The signal output at output B2 opens the separating switches TR2b, TR1b-2 and TR2b-2. The switches controlled by the control circuit SS1 keep their status with no change.

It is important to note at this point that the switching signals output by the control circuits SS1 and SS2 for the separating switches are timed relative to each other so that the switches lettered a and the switches lettered b are never open at the same time. This means in the concrete case, for example, that the separating switches TR2b, TR1b-2 and TR2b-2 are not opened by the signal at output B2 until the separating switches TR2a, TR1a-2 and TR2a-2 have already been closed. How the control circuits SS1 to SS32 are configured to achieve this time relationship of the signals output at A and B will be explained later with reference to FIG. 5.

Thus, when due to the control circuit SS2 being activated the signal at its output A2 closes the separating switches TR2a and TR1a-2, current source S2 is also connected to the charging circuit L1. This results in the output voltage V1 increasing steeper in the range $t_0$ to $t_1$ than depicted in FIG. 3 so that the further increase in the output voltage V1 triggered by the output signals SM1 at input 22 at the point in time $t_1$ commences from a higher voltage value, resulting in the voltage value scaled for the phase relative to the phase signal Ph1 of 0.5 in the plot as shown in FIG. 3 being attained at an earlier point in time. The difference to the phase of the signal V1 as shown in FIG. 3 is $\Delta\phi_0/32$ where $\Delta\phi_0$ is the difference in phase of the phase signals Ph1 and Ph2.

By activating the control circuits SS1 to SS32 in sequence the reference point dictating the phasing of the voltage V1 can now be incrementally shifted by $\Delta\phi_0/32$ in each case.

Analogous considerations apply to generating the output voltage V2 which is a 180° phase-shifted version of the output voltage V1. This voltage V2 is obtained in the charging circuit L2 by correspondingly opening and closing the phase switches PS2a-1, PS2b-1 to PS2a-32, PS2b-32 as well as the corresponding separating switches TR1b to TR32b and TR2b-1, TR2b-32.

The shift in the reference point of the output voltage V1 is greatest when all control circuits SS1 to SS32 are activated. In this case all current sources S1 to S32 as controlled by the signals SM1 and SM2 can be effectively connected to the charging circuit L1 so that the increase in the voltage V1 in the range $t_0$ to $t_1$, as well as, as of point in time $t_1$ up to the maximum takes place substantially quicker. This is why the reference point with the scaled voltage value 0.5 is attained earlier, the difference between the point in time $t_2$ and the earlier point in time $t_2'$ corresponding to the time spacing between $t_1$ and $t_0$. It has thus been demonstrated how with the aid of the circuit as shown in FIG. 4 the reference point located on the leading edge of the voltage V1 can be shifted by activating in sequence the control voltages SS1 to SS32, namely in 32 steps of $\Delta\phi_0/32$ each.

To achieve a further shift of the reference point on the leading edge, the phase select circuit changes over the multiplexer 12 so that it outputs a signal derived from the phase signal output at output 3 of the oscillator 10. It is in this way that the interpolator 18 receives two output signals SM1 and SM2 derived from the phase signal $Ph^3$ or phase signal $Ph^2$. In this arrangement the multiplexers 12 and 14 swap their roles, it now being the multiplexer 14 that furnishes the signal determining the reference phase. When the control circuits SS1 to SS32 are then again activated by ways and means as detailed above, an output voltage V1 is received, the phase of which is further shifted in steps of $\Delta\phi_0/32$ each relative to the phasing of the phase signal Ph2 serving as the reference, thus making it possible by the control via the phase select circuit 16 to continually flip the ranges one after the other in which the output voltage V1 is changed every time by the steps $\Delta\phi_0/32$. This accordingly attains the desired object of generating a signal whose phase can be changed over the full range of 360° relative to a reference phase. When a transition from one phase value to the next occurs within a range between two output phases of the oscillator, phase jitter is prevented by the control circuit actuating the separating switches TR1a and TRb to TR32a and TR32b, as described above, so that the switches assigned in each case to one current source are never open at the same time, no phase jitter in the output signal likewise being present in the transition from one range of the output phases of the oscillator to the next. This results from the fact that in this transition both the switches PS1*a*, PS1*b* controlled thereby by the multiplexer output signals and the corresponding current source are parted from the output V1, V2.

Figure 5:
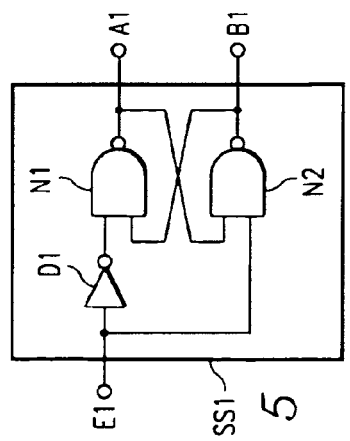
FIG. 4 is a more accurate circuit diagram of the circuit assembly in accordance with the invention and FIG. 5 illustrates an example embodiment of a control circuit for controlling the separating switches.

Referring now to FIG. 5 there is illustrated a configuration of the control circuits in which the control circuit SS1 shown by way of an example in FIG. 5 contains two NAND circuits N1 and N2. The input E1 is connected via a delay element D1 formed by a negator to the input of the NAND circuit N1 and it is directly connected to the input of the NAND circuit N2. The other inputs in each case of the NAND circuits N1 and N2 are crosswise-connected to the output of the corresponding other NAND circuit. Each of the outputs of the NAND circuits N1 and N2 forms the outputs A1 and B1 respectively of the control circuit SS1. The control circuit SS1 as evident from FIG. 5 behaves so that the signals output at the outputs A1 and B1 never have the value "0" at the same time when the input signal E1 changes from a "1" to a "0" or vice-versa. When the separating switches as shown in FIG. 4 are then configured so that they are closed when the signals at the outputs A and B are "1" and are opened when these signals are "0", the circuit as shown in FIG. 5 then achieves that these separating switches are never open at the same time.

What is claimed is:

1. A circuit for generating an output phase signal with a variable phase shift relative to a reference phase, including an oscillator outputting phase signals at n outputs, each of which is shifted in phase by $\phi=360°/n$ from one output to the next and is correspondingly staggered in time relative to each other by $\Delta t$, a first multiplexer, the inputs of which are connected to the even-number outputs of the oscillator and which passes on to its output a phase signal output by an output x of the oscillator as a function of a phase selection signal output by a phase select circuit, where x is a selected one of the n outputs of the oscillator, a second multiplexer, the inputs of which are connected to the odd-number outputs of the oscillator and which passes to its output on a phase signal output by an output x +1 of the oscillator as a function of a second phase selection signal output by the phase select circuit, a phase interpolator receiving the phase signals output by the multiplexers and controlling with these the periodic opening and closing of a first set of phase switches in the time spacing of $\Delta t$, the phase interpolator containing a first charging circuit in which a charging voltage of a capacitor is varied by switching current sources assigned to the first set of phase switches on or off in accordance with the closing or opening of the first set of phase switches, whereby a number of current sources is provided corresponding to the number of interphase shift values to be generated between the phase shifts of the phase signals output by the first and second multiplexers, to each of which at least two phase switches are assigned, of which the one in each case is controlled by the phase signal output by the first multiplexer and the other by the phase signal output by the second multiplexer, a first separating switch being inserted in the connection between a first of the at least two phase switches and the assigned current source, an a second separating switch being inserted in the connection between a second of the at least two phase switches, thereby providing a first set and a second set of separating switches for said number of current sources, characterized in that in each connection between each of said first phase switches and the first charging circuit a third separating switch is inserted, and in each connection between each of said second phase switches a fourth set of separating switches is inserted, thereby providing a third set and a fourth set of separating switches, and that a control circuit is provided for each current source which ensures that the first set and the third set of separating switches assigned to each phase switch operate in a first phase, and the second set and the fourth set of separating switches assigned to the same phase switch operate in a second phase reverse to the first phase, and are activated to switch the separating switches for the current sources in a cycling sequence when there is a change in the phasing of the output phase signal relative to the reference phase.

2. The circuit in claim 1, characterized in that a second charging circuit is provided, that parallel to each of the first phase switches a third set of phase switches is arranged, and parallel to each of the second phase switches a fourth set of phase switches is arranged, which can be switched opposite in phase to that of the phase switch with which it is in parallel, and that in the connection between the third phase switch in each case and the second charging circuit a fifth set of separating switches is inserted in each case which is signaled equal in phase to the third set of separating switches and that in the connection between the fourth phase switch in each case and the second charging circuit a sixth set of separating switches is inserted in each case which is signaled equal in phase to the fourth set of separating switches resulting in a second output phase signal (V2) being producible from the second charging circuit (L2) which is phase-shifted by 180° relative to the output phase signal (V1) generated by the first charging circuit (L1).

* * * * *